United States Patent
Melde et al.

(10) Patent No.: US 9,829,798 B2
(45) Date of Patent: Nov. 28, 2017

(54) FLOW LITHOGRAPHY TECHNIQUE TO FORM MICROSTRUCTURES USING OPTICAL ARRAYS

(71) Applicant: Palo Alto Research Center Incorporated, Palo Alto, CA (US)

(72) Inventors: Kai Melde, San Francisco, CA (US); Philipp H. Schmaelzle, Los Altos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 78 days.

(21) Appl. No.: 13/835,631

(22) Filed: Mar. 15, 2013

(65) Prior Publication Data

US 2014/0268077 A1     Sep. 18, 2014

(51) Int. Cl.
| | |
|---|---|
| G03B 27/54 | (2006.01) |
| G03F 7/20 | (2006.01) |
| G03F 7/24 | (2006.01) |
| B81C 99/00 | (2010.01) |
| G03F 1/50 | (2012.01) |
| G03F 7/16 | (2006.01) |

(52) U.S. Cl.
CPC ...... *G03F 7/70141* (2013.01); *B81C 99/0095* (2013.01); *G03F 1/50* (2013.01); *G03F 7/16* (2013.01); *G03F 7/2012* (2013.01); *G03F 7/24* (2013.01)

(58) Field of Classification Search
CPC .................................................. G03F 7/70141
USPC ................. 355/52, 53, 55, 67; 430/320, 322
See application file for complete search history.

(56) References Cited

U.S. PATENT DOCUMENTS

| | | | |
|---|---|---|---|
| 6,383,690 B1 | 5/2002 | Vargas | |
| 7,057,832 B2 | 6/2006 | Wu et al. | |
| 7,709,544 B2 | 5/2010 | Doyle et al. | |
| 8,252,517 B2* | 8/2012 | Thomas et al. | 430/320 |
| 2003/0122091 A1* | 7/2003 | Almogy | 250/492.24 |
| 2006/0132750 A1* | 6/2006 | Gui et al. | 355/69 |
| 2007/0105972 A1* | 5/2007 | Doyle et al. | 522/1 |
| 2010/0123885 A1 | 5/2010 | Kobrin | |
| 2010/0172898 A1 | 7/2010 | Doyle et al. | |

(Continued)

FOREIGN PATENT DOCUMENTS

| | | |
|---|---|---|
| EP | 1 845 418 A2 | 10/2007 |
| WO | WO 2008/063758 A2 | 5/2008 |

(Continued)

OTHER PUBLICATIONS

Anish Tuteja et al., "Robust omniphobic surfaces," PNAS, vol. 105, No. 47, pp. 18200-18205, Nov. 25, 2008.

(Continued)

*Primary Examiner* — Hung Henry Nguyen
(74) *Attorney, Agent, or Firm* — Fay Sharpe LLP (57) ABSTRACT

A continuous flow projection lithography system to form microstructures using an optical array incorporated in a continuous coating process is provided. A mask is placed at a distance from the array. Each element of the array projects one image of the mask onto a substrate, effectively forming an array thereon. A coating process allows flows that can be used to define functional regions of particles or supporting layers that prevent adhesion of crosslinked polymers to surfaces.

31 Claims, 11 Drawing Sheets

(56) References Cited

U.S. PATENT DOCUMENTS

2014/0168622 A1   6/2014   Mizumura et al.

FOREIGN PATENT DOCUMENTS

WO   WO 2013/018699 A1   2/2013
WO   WO 2013/035489 A1   3/2013

OTHER PUBLICATIONS

Jun Mei et al., "Dark acoustic metamaterials as super absorbers for low-frequency sound," Nature Communications, pp. 1-7, 2012.
Dhananjay Dendukuri et al., "Stop-flow lithography in a microfluidic device," The Royal Society of Chemistry, Lab Chip, pp. 818-828, 2007.
Matthew E. Helgeson et al., "Hydrogel microparticles from lithographic processes: Novel materials for fundamental and applied colloid science," Current Opinion in Colloid & Interface Science 16, pp. 106-117, 2011.
Ming-Hsien Wu et al., "Fabrication of two-dimensional arrays of microlenses and their applications in photolithography," Journal of Micromechanics and Microenginerring, pp. 747-758, 2002.
European Search Report for 14158890.5 dated Feb. 23, 2016.
David C. Pregibon et al., Multifunctional Encoded Particles for High-Throughput Biomolecule Analysis, Science, vol. 315, pp. 1393-1396, Mar. 9, 2007.

* cited by examiner

FLOW LITHOGRAPHY TECHNIQUE TO FORM MICROSTRUCTURES USING OPTICAL ARRAYS

BACKGROUND

There is a known particle forming process called Stop-Flow-Lithography which uses microfluidic channels and a system interface that allows starting and stopping the flow at specific times. The fluid typically contains a precursor (e.g. PEG-DA) and a photoinitiator. When the channel is filled with the solution, the flow is stopped, and a microscope objective projects a pattern of ultraviolet (UV) light into the channels to initiate local polymerization. This creates a two-dimensional (2D) shaped bulk of crosslinked polymer that becomes the particle. After polymerization, the flow is restarted, the particles are flushed out and replaced by new precursor, and the next particle is synthesized. In this Stop-Flow-Lithography technique, the creeping flow at finite Reynolds numbers, which is typical for microfluidic channels, allows leveraging properties, such as diffusion based mixing, to create arbitrary, anisotropic 2D particles with stripes or internal gradients of various properties like fluorescent dyes or controlled concentration of colloid particles.

However, it is difficult to scale the Stop-Flow-Lithography technique to an industrial setting because it relies on closed micro-channels and single microscope objectives per channel. Further, particles tend to stick to the top and bottom channel walls during polymerization. This limits its use as a continuous process.

Also, microlens arrays have been used for projection lithography, most notably in work relating to complex patterning of sub-micrometer features over large area surfaces using PDMS stamps with integrated glass microspheres as lenses.

BRIEF DESCRIPTION

In one aspect of the presently described embodiments, a system comprises a light source, a mask having or generating at least one mask feature and being positioned to convey light from the light source, a moving target substrate having precursor material carried thereon and an array of optical elements positioned to such that each optical element corresponds to a mask feature projected from the light source via the mask onto the moving target substrate to form microstructures in the precursor material.

In another aspect of the presently described embodiments, the array of optical elements is formed on a surface of a cylinder.

In another aspect of the presently described embodiments, the array of optical elements is a microlens array.

In another aspect of the presently described embodiments, the array of optical elements is a mirror array.

In another aspect of the presently described embodiments, the light source and mask are positioned on an interior of the cylinder.

In another aspect of the presently described embodiments, the light source and mask are positioned on an exterior of the cylinder.

In another aspect of the presently described embodiments, the cylinder is formed of glass material.

In another aspect of the presently described embodiments, the light source is an ultraviolet light source.

In another aspect of the presently described embodiments, the mask comprises at least one of a static mask or a digital micromirror device.

In another aspect of the presently described embodiments, a system comprises a light source, a mask having or generating at least one mask feature and being positioned to convey light from the light source, an array of optical elements positioned such that each optical element corresponds to a mask feature projected from the light source via the mask and a cylinder having a surface with wells formed therein to align with the optical elements, the surface configured to carry precursor material in which microstructures are formed based on light projected from the light source onto the precursor material.

In another aspect of the presently described embodiments, the system further comprises a source for the precursor, the source being configured to coat the cylinder with the precursor material.

In another aspect of the presently described embodiments, the system further comprises a target to which formed particles are transferred from the cylinder.

In another aspect of the presently described embodiments, the array of optical elements is on the surface of the cylinder.

In another aspect of the presently described embodiments, the array of optical elements is positioned on the exterior of the cylinder.

In another aspect of the presently described embodiments, the light source and mask are positioned on an interior of the cylinder.

In another aspect of the presently described embodiments, the light source and mask are positioned on an exterior of the cylinder.

In another aspect of the presently described embodiments, the cylinder is formed of a glass material.

In another aspect of the presently described embodiments, the light source is an ultraviolet light source.

In another aspect of the presently described embodiments, the mask comprises at least one of a static mask or a digital micromirror device.

In another aspect of the presently described embodiments, a method comprises projecting a mask feature on precursor material with light, focussing the projected light on the precursor material to initiate synthesis of the material to form microstructures or microparticles based on the mask feature and continuously feeding the material so that light projects on different portions of the material to form additional microstructures or microparticles.

BRIEF DESCRIPTION OF THE DRAWINGS

FIG. 10(*a*) is a representative view of a system according to the presently described embodiments; and FIG. 10(*b*) is a representative view of a system according to the presently described embodiments.

DETAILED DESCRIPTION

There is a general interest in science and industry to fabricate microparticles or microstructures of custom shape and composition. Examples include barcode identified particles for complex biological analysis systems, functional particles for drug delivery, or inhomogenous particles (e.g., varying density, chemical composition, Janus particles) for self-assembly in coatings or as building blocks for functional materials. A scalable and cost-effective fabrication method for such particles has not been achieved by prior techniques.

However, the presently described embodiments relate to continuous flow projection lithography for forming or synthesizing microparticles or microstructures using optical arrays such as a microlens array in a continuous coating process. For one implementation of such lithography, a mask is placed at a distance, e.g., a distance much greater (e.g., 'infinity') than the focal length of a single lens, from the array. An advantage of this technique is multiplexing: each element, or microlens, of the array projects one image of the mask onto a substrate, effectively making copies to achieve an array (e.g., an N×M array). In some forms, conventional coating processes, such as slot, slide or curtain coating, allow multilayer flows that can be used to define functional regions of particles or supporting layers that prevent adhesion of crosslinked polymers to, for example, a web surface used to carry the particles or microstructures. Also, a micromirror array with suitable system changes can be used as an optical array rather than the microlens array. Still further, the mask can take a variety of forms including a static mask (e.g. a fixed binary mask) and/or a dynamic mask (e.g. digital micromirror device(s)).

The systems and methods described in connection with the presently described embodiments can be used in a variety of different applications. For example, various particles can be formed using these techniques. In some forms, particles are customized in size and shape. Particles may be defined by a two-dimensional mask, wherein a third dimension (e.g., thickness) is defined by a thickness of the active material in which the particle is formed using the two-dimensional mask. Particles formed according to this technique may also be formed of one or more different polymeric materials that are cross-linked to each other during the process. Multi-layer particles may also be formed using multilayer films. Still further, particles may be formed of polymers with additives such as dyes and colloids. Particles formed according to the presently described embodiments may then be used in a variety of different environments including, for example, biological environments, functional environments such as drug delivery, and self-assembly or building environments.

Figure 1A:
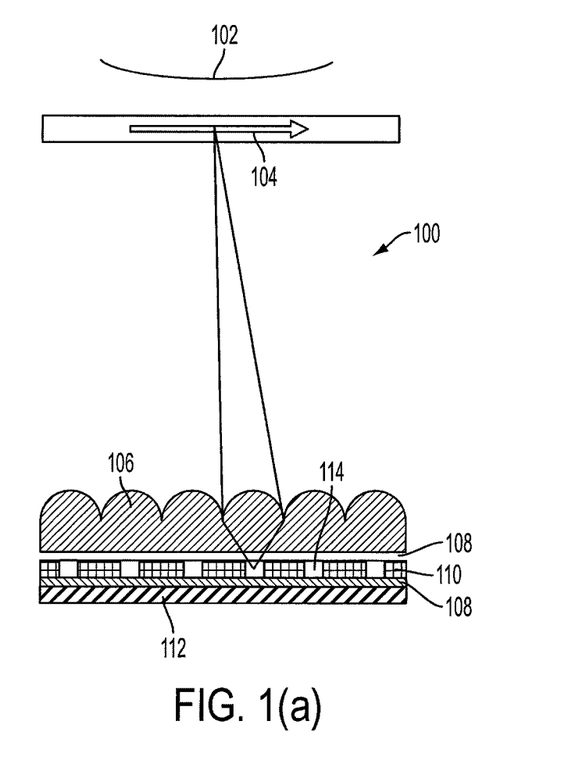
FIG. 1(a) is a representative view of a system according to the presently described embodiments.

FIG. 1(*a*) shows an example implementation of such a process using an optical array and a mobile substrate. In this regard, it is practicable to apply the coating flow with a free surface and leave an air gap or provide a sheath between the optical array and the liquids carried on the mobile substrate. As shown in FIG. 1(*a*), a system 100 includes a light source 102 and a mask 104. Light projects from the light source 102 through the mask 104 onto an optical array such as a microlens array 106 to form particles 114 in the active layer formed of liquid or precursor material 110. Also shown are a moving substrate 112 and air gaps or sheaths 108 positioned to prevent binding between the precursor material 110 and the moving substrate 112 or array 106.

The light source 102 may take a variety of forms. In one form, the light source is an ultraviolet light source (e.g., having a wavelength less than 450 nanometers). It should be appreciated that the light source may take a variety of other forms depending on the process for synthesizing or polymerization of the particles. For example, if thermal polymerization is used, an infrared light source may be used.

The mask 104 may likewise take a variety of forms. As shown, the mask 104 is a mask used for lithography and may have a variety of configurations. For example, the mask may be a static mask such as a fixed binary mask, may be a printed mask or may be a chrome mask. As an example, a laser-cut binary mask may be suitably implemented in the system according to the presently described embodiments. In any event, the mask may also include a diffuser layer or have an appropriate diffuser positioned in connection with the mask. Also, as will be described later, instead of a static mask such as a fixed binary mask, it is also possible to use digital micro-mirror devices that allow more possibilities to create complex patterns onto a moving substrate.

The optical array may take a variety of forms. In one form, the optical array is a microlens array. Such an array can have a variety of parameters. However, in one form, the microlens array is a linear lens array having a pitch of 5 mm and a focal length of 10 mm. As will be described later, the optical array 106 may also take the form of a mirror device or array such as a micromirror device or array.

If a sheath 108 is used rather than an air gap, a variety of materials may comprise the sheath. In one form, the sheath is a liquid such as polyethylene glycol (Mw=300).

The moving substrate 112 may take a variety of forms. The moving substrate 112 is, in at least one form, operative to carry the active layer that is worked upon in the system to form the particles. As shown, the moving substrate is a generally flat conveyor type substrate.

With respect to the active layer, the fluid, liquid or precursor material 110 may take a variety of forms. In one form, the precursor material is a polyethylene glycol diacrylate (400) mixed with a photoinitiator such as DAROCUR 1173 (3% v/v). Of course, this is merely an example. Other UV curable polymers or other types of synthesizable material may be used. Further, the active layer may include liquid or fluid precursor material of the same or different composition separated by film material. Such a multilayer configuration may be used to form a multi-layer particle or structure. Multiple layers in the active layer may also be used for supporting the liquid, or the multilayer configuration (using one or more film layers) may also assist in preventing polymerization of the liquid to the substrate, for example.

Figure 1B:
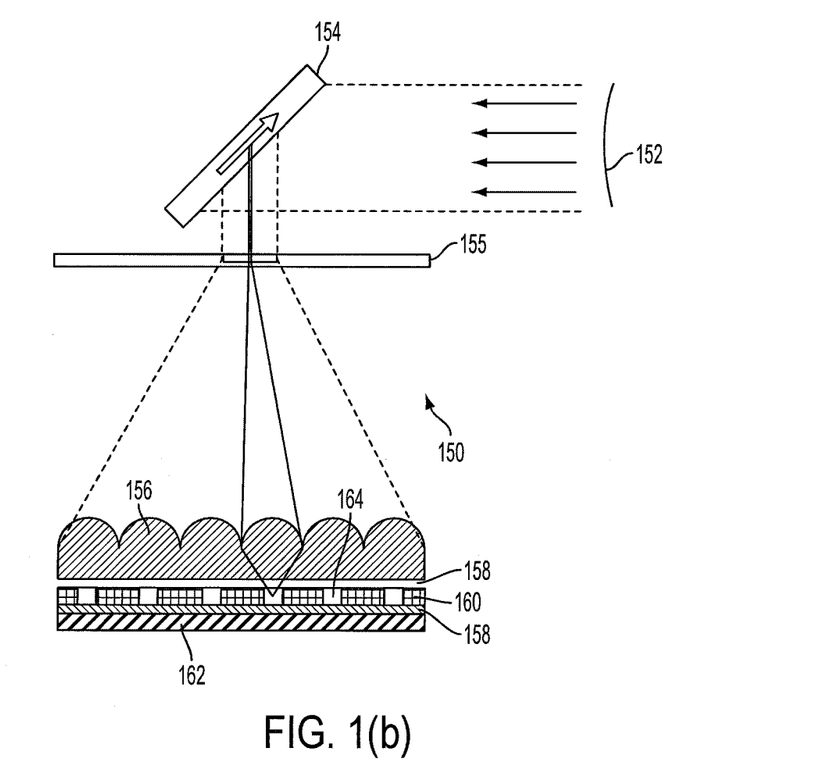
FIG. 1(b) is a representative view of a system according to the presently described embodiments.

With reference to FIG. 1(*b*), in a system 150, the mask 104 is replaced with a dynamic mask 154 that comprises at least one digital micro-mirror device (DMD) that allow more possibilities to create complex patterns onto a moving substrate. The mask 154 also allows for the projected pattern to be changed at any time between or during exposure processes. In this regard, such a mask 154 is set at an appropriate angle and operates in a manner that those of skill in the art will appreciate—generating a mask feature by reflecting light from a light source 152 into a pattern. In at least one form, this configuration allows for the light source 152 to be positioned as shown offset from the projection of light from the mask 154 through a diffuser 155 to the optical array 156. As above, the light is focused by the lens array 156 onto precursor material 160 to form microparticles or microstructures 164. The precursor material is carried on a moving substrate 162 and is provide with air gaps or sheaths 158. Like elements in FIGS. 1(*a*) and 1(*b*) share like characteristics and alternatives. It also should be appreciated that this type of mask 154 and suitable configuration could be implemented in the other embodiments described in the present disclosure including those shown in FIGS. 2, 3, 4, 5, and 6(*a* and *b*).

In operation, the light source 102 (or 152) projects light in the form of a mask feature or pattern through or via the mask 104 (or 154) upon the precursor material carried on the moving substrate 112 (or 162). The optical array 106 (or 156) focuses the projected light onto the precursor material to initiate polymerization or synthesis of the precursor material in the form of the mask feature or pattern. Such polymerization or synthesis allows for formation of the microstructures or microparticles according to the presently described embodiments.

In systems according to the presently described embodiments, the flow of liquids with the movement of the substrate and/or the lens array allows continuous feed of new precursor material for the formation of fabricated microparticles or microstructures. In this regard, the material is fed through the system so that, once the noted polymerization or synthesis forms microstructures or microparticles, light is projected on different areas of the material to form additional microstructures or microparticles. A continuous and scalable process is realized in a variety of forms.

For continuous high speed or step-wise operation, the optical or lens array moves along with the substrate so that each lens projects to the same spot during the exposure time. There are multiple ways to realize such a function, one being a hollow glass cylinder with the lens array laminated to the outside. A light source, diffuser and mask are positioned, in one form, in the hollow center and the outer cylinder rotates, synchronized to a passing web.

Figure 2:
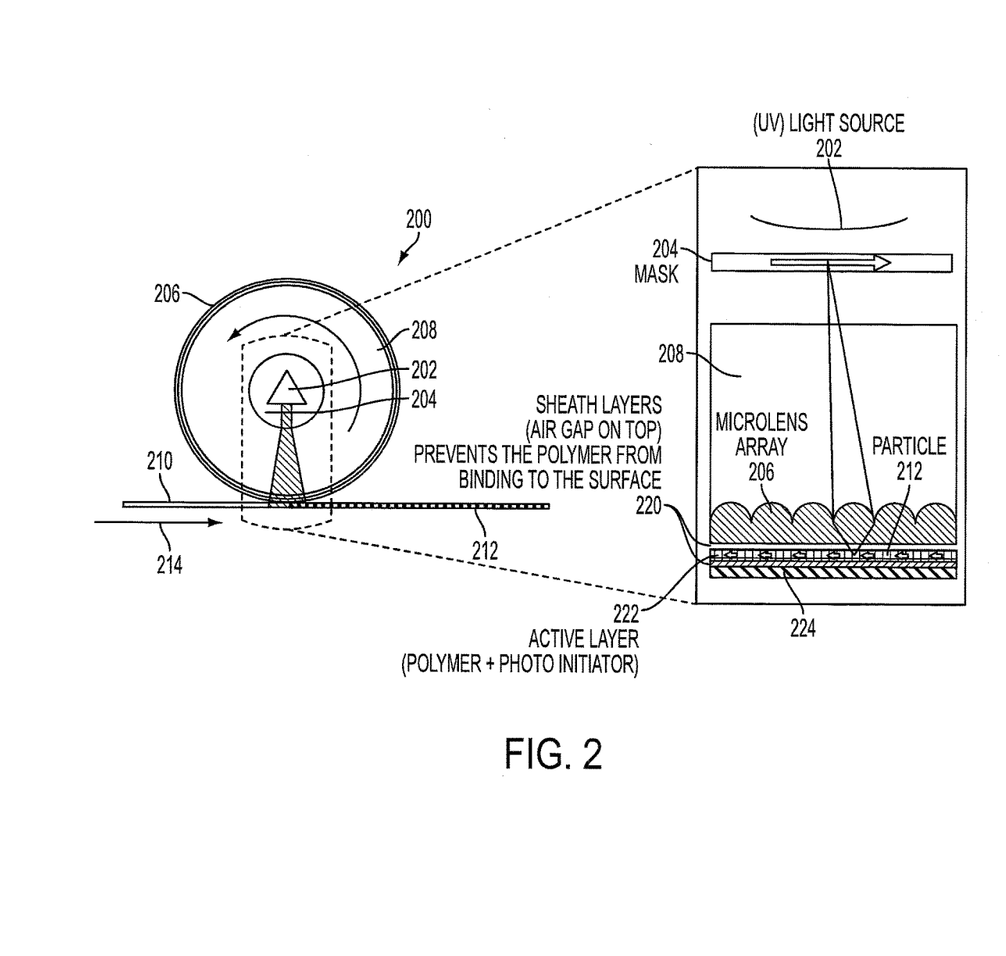
FIG. 2 is a representative view of a system according to the presently described embodiments.

With reference now to FIG. 2, a system 200 using a fixed inner roll and rotating outer cylinder (with the outer cylinder being velocity matched to the substrate) is illustrated. The system 200 includes a light source 202 and a mask 204. Light projects from the light source 202 through the mask 204 and through the optical (e.g., microlens) array 206 to form particles 212 in the precursor material 210 of the active layer 222 of the system 200. Also shown are sheath layers 220, or air gaps, and a moving substrate 224.

In this embodiment, continuous movement is realized using the cylinder 208 having the microlens arrays 206 formed on a circumferential surface thereof. As shown, the cylinder 208 is formed of glass material and is hollow so that the light source, mask and diffuser can be positioned on an interior of the cylindrical surface. The glass cylinder 208 is transparent to light so as not to inhibit the projection of light from the light source to the precursor material. In one form, the distance from the mask to the lens is greater than ten times the focal length of the lens (e.g., infinity). In operation, light projects from the light source 202 through the mask 204 and any diffuser layer, and through the microlens array 206 on the surface of the cylinder 208 to the precursor material 222 that is carried on the moving substrate 210. It is to be appreciated that the cylinder rotation is synchronized with the substrate to follow the flow and allow for proper formation of particles in the precursor material.

As an alternative to the cylinder 208, a disc configuration (not shown) may be used. In such an embodiment, a rotating disc with lenses laminated on one of the cylindrical surfaces could be utilized such that the disc is rotated in synchronized fashion with the substrate to follow the flow. In this regard, the disc would replace the cylinder as a substrate for the microlens array.

To achieve higher precision, a gravure coating process to synthesize particles on a structured roll before being placed onto a substrate or flushed off into a collection bath is implemented. The precursor material is brought onto the roll via, for example, a slot-bead die that is suitable for very slow to high coating speeds. Wells (such as microwells), ridges or other surface features on the cylinder surface help preserve the integrity of particles during stamping and reduce mixing or slip of the multiphase flows during exposure. Such a process could be run continuous or in a step-wise fashion.

Figure 3:
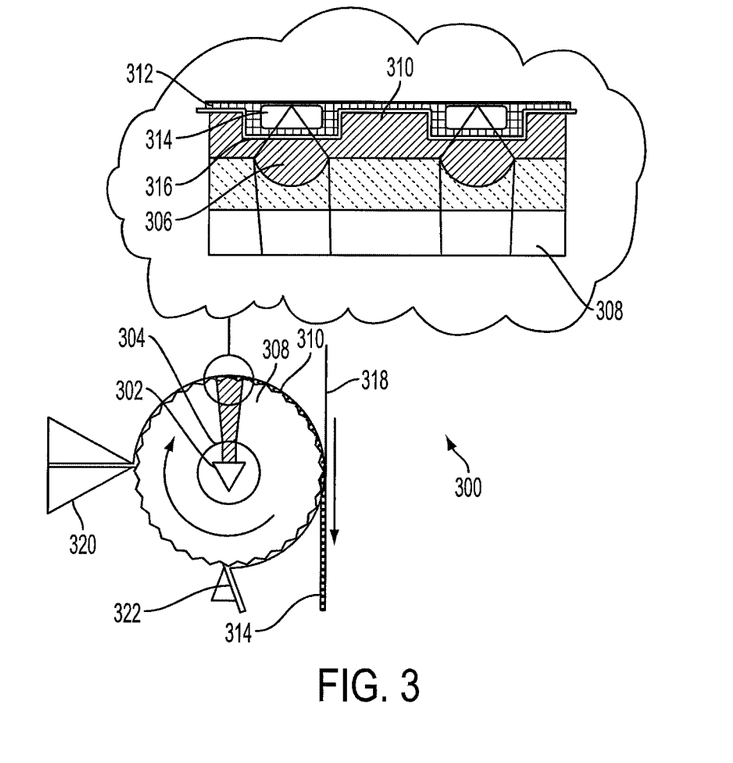
FIG. 3 is a representative view of a system according to the presently described embodiments.
Figure 4:
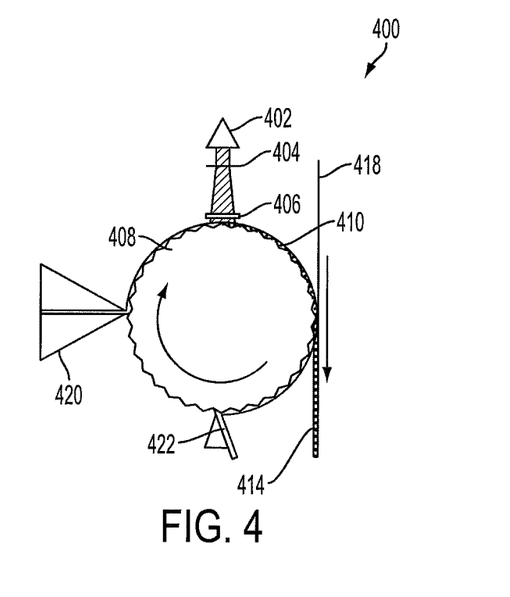
FIG. 4 is a representative view of a system according to the presently described embodiments.
Figure 5:
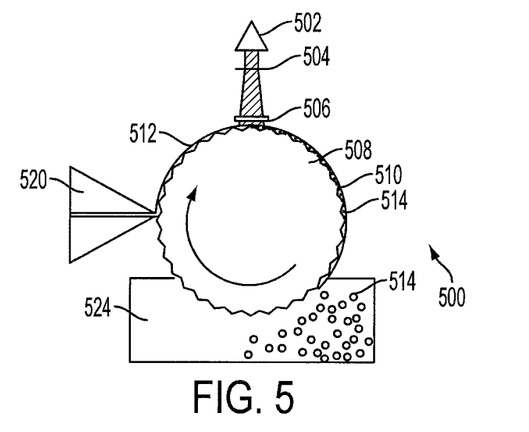
FIG. 5 is a representative view of a system according to the presently described embodiments.

With reference now to FIG. 3, a system 300 is illustrated where a Gravure coating process and microlens photolithography are implemented. The system 300 includes a light source 302 and a mask layer 304. Light projects from the light source 302 through the mask 304, and through the optical or microlens array 306 to form particles 314 in the precursor material 312. Also shown between the microlens array 306 and the precursor material 312 is an anti-stiction layer 316. The system is further provided with a moving substrate 318 upon which the precursor 312 and particles 314 are released and carried flow. A precursor source 320 is provided to apply precursor material to a cylinder 308. In one form, the precursor source is a slot-bead die but could take other forms including a curtain coater, spray coater, or dip-coating mechanism. In this regard, the cylinder 308 is provided with surface features (such as wells (e.g., microwells) or ridges) 310 to assist in the formation of microstructures by confining a polymerization site and aligning with elements of the optical array during continuous or step-wise processing. Also shown in FIG. 3 is a knife edge 322 for skimming excess liquid from the surface of the cylinder.

In a further embodiment, the system resembles that of FIG. 3 but the light source and mask are provided on the exterior of the cylinder. In this regard, with reference to FIG. 4, a system 400 is illustrated. The system 400 includes light source 402 and a mask layer 404. Light is projected from the light source 402 through the mask layer 404, and also through an optical or microlens array 406. The microlens array 406 focuses the light upon the cylinder 408 having surface features 410. Also shown in the system 400 are particles 414 that are formed in the precursor material 412 and a moving substrate 418. A precursor or liquid source 420 and a knife edge 422 are also provided.

In a further embodiment, a moving substrate upon which formed particles are released and carried is not necessary. Formed particles are simply conveyed to a further processing operation using other techniques. In this regard, with reference to FIG. 5, a system 500 includes a light source 502 and a mask layer 504. Light projects from the light source 502 through the mask layer 504 and also through an optical or microlens array 506. Focused light from the microlens array 506 projects upon the cylindrical roll 508 having surface features 510. Note that the liquid or precursor material 512 has formed therein particles 514 which are released from the surface of the cylinder into solvent pool 524. The particles 514 are then conveyed or transported to other processing steps.

Figure 6A:
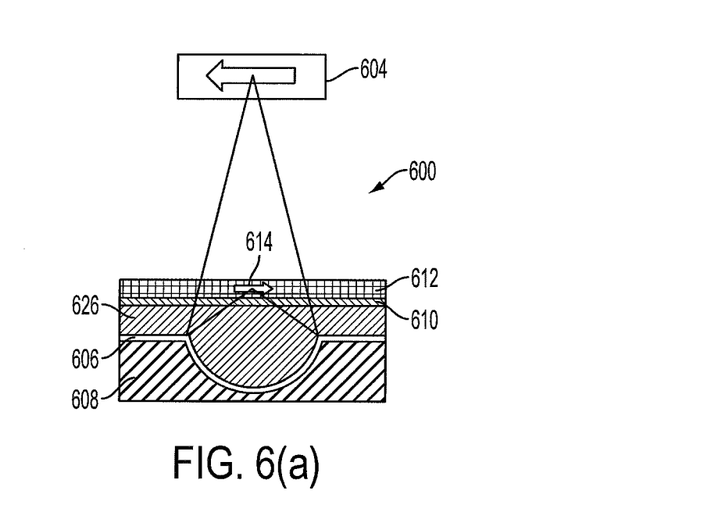
FIG. 6(a) is a representative view of a system according to the presently described embodiments.
Figure 6B:
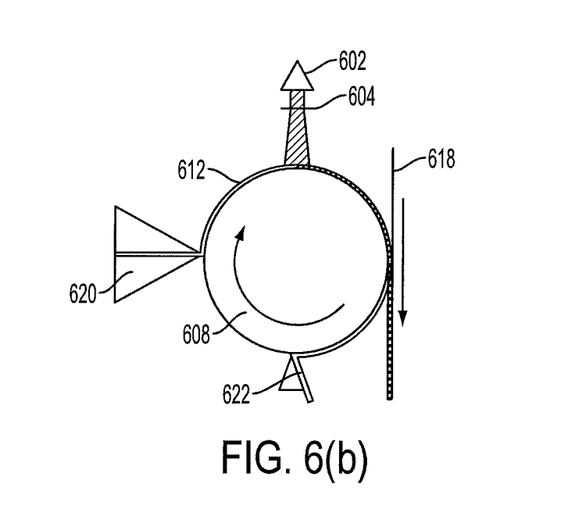
FIG. 6(b) is a representative view of a system according to the presently described embodiments.

With reference now to FIGS. 6(a) and 6(b), a still further embodiment is illustrated. A system 600 is shown having a light source 602 projecting light through a mask 604. The projected light reflects off a mirror 606 of a mirror array, such as a micromirror array, back to the precursor material 612 to form particle 614. Also shown are a support layer 610 and a transparent coating 626. It is to be appreciated that the system 600 includes the cylinder 608 having an array of optical elements, namely the mirror array including the mirror 606, formed on its surface. Also shown are moving substrates 618 upon which particles 614 are released and conveyed from the system 600. A liquid feed device 620 and a knife edge 622 for removing excess liquid are also illustrated.

The system such as the system 600 allows for mirror arrays (e.g. micromirror arrays) positioned so that the target is between the mask and the mirror. The mirror arrays can be formed as a part of the mechanical supporting structure for inherent alignment with the flow of the precursor material. It should be appreciated that in such a system, the light from the light source passes through the precursor material twice. In these circumstances, in at least one form, the first pass of light does not initiate polymerization enough to have a meaningful impact on the actual polymerization—which is initiated in a meaningful manner by the second pass of the light through the precursor material. In this regard, a concentration factor in mirror diameter should be chosen so that the first pass of light does not polymerize the material enough to impair the overall process.

The actual design of the system according to the presently described embodiments depends on the actual targeted application for the system. In this regard, with reference to FIG. 7, wherein a system 700 shows a two-dimensional shape defined by mask and particle height equals polymer layer thickness h. In such a system, $\theta < 10° \rightarrow D \gg B$ and $D \gg f$ Collimated UV light and a non-scattering diffuser before mask provide even illumination over the designed space angle (illumination cone)

Figure 7:
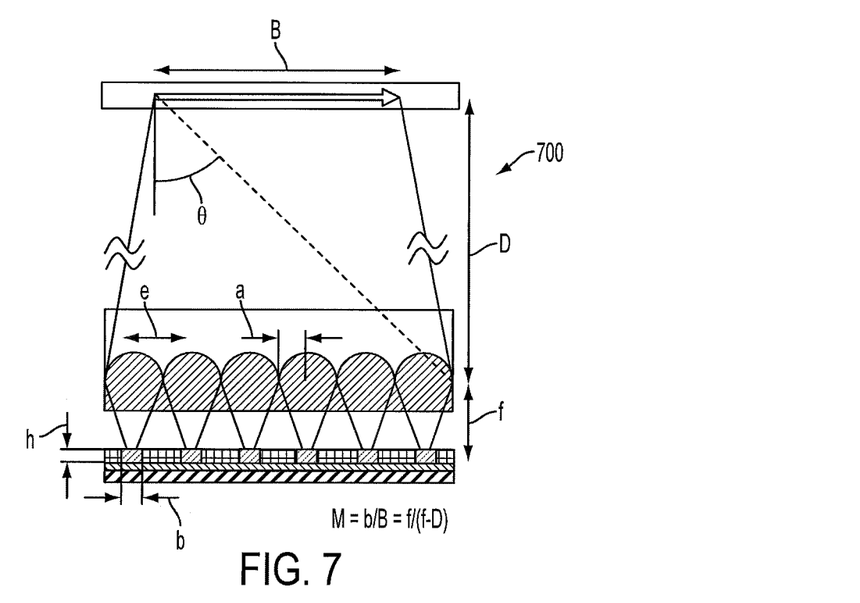
FIG. 7 is a representative view of a system according to the presently described embodiments.

Numerical aperture of lens NA $\sim a/f$ with $a=e/2$

Magnification $M=f/(f-D)=b/B$

For a linear array the number of lenses per unit is:

$N \sim (2*\tan(\theta)*D)/(k*b)$ with $k=a/b$

Figure 8:
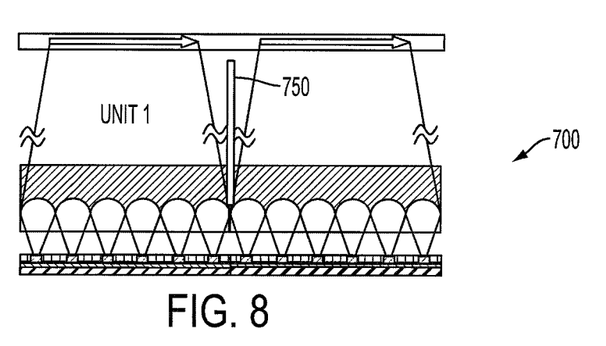
FIG. 8 is a representative view of a system according to the presently described embodiments.

Example: $D=100$ mm, $\theta=5.7°$, $B=1$ mm, $NA=0.1$, $f=5$ mm $\rightarrow N=20$, $W=20$ mm, $a=0.5$ mm, $a=1$ mm, $b=50$ μm Units of width W would be put next to each other to scale up on a single roll With reference to FIG. 8, a divider 750 may be implemented to prevent cross exposure of the lenses at the border. Such a divider 750 can also be provided to enhance structural integrity and mechanical stability of the device.

Figure 9:
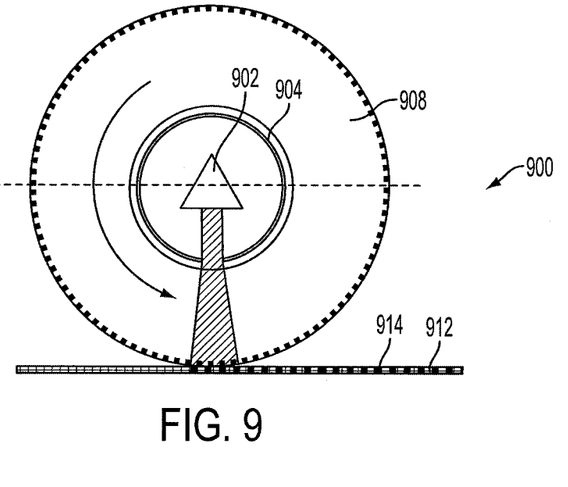
FIG. 9 is a representative view of a system according to the presently described embodiments.
Figure 10A:
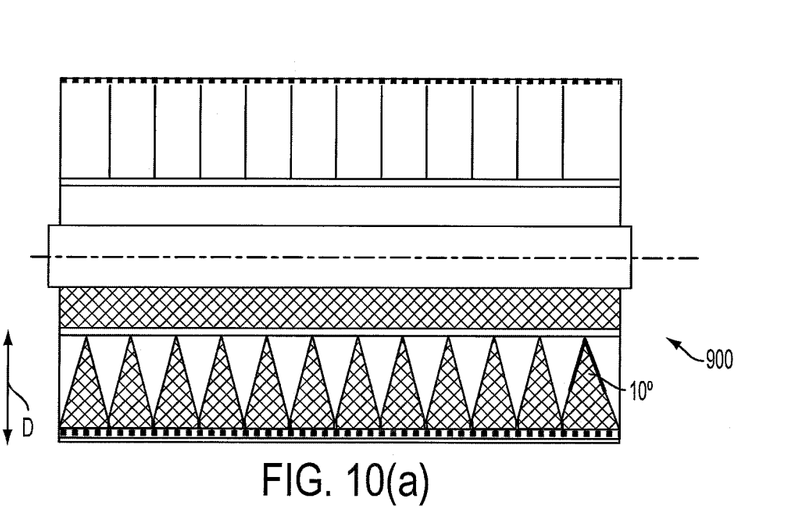
Figure 10B:
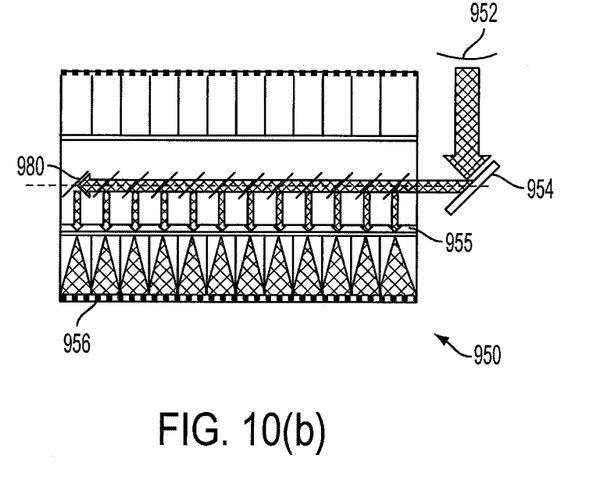

With reference now to FIGS. 9 and 10(a), an example of the roll design is illustrated. As shown, the system 900 includes a light source 902 and mask layer 904. A cylinder 908 is formed of glass material so that the light projected from the light source 902 through the mask layer 904 can appropriately polymerize the precursor material 912 to form microstructures or microparticles 914. As shown, the light source, diffuser, and mask are fixed in the interior of the cylinder. These elements are not rotating. The cylinder, however, is rotating in this form. With such a configuration, as illustrated in FIG. 10(a), multiple processing lines can be provided by the cylindrical configuration. Of course, the number depends on the roll diameter and the resolution requirements. However, the system 900 shown in FIG. 10(a) shows the configuration of the multiple processing lines defined in twelve unit cells on each cylinder. FIG. 10(b) shows a similar configuration illustrating multiple processing lines but varies inasmuch as a system 950, similar to that shown in FIG. 1(b) using a digital micromirror device(s) as a mask, is implemented as an example. As shown, the system includes the light source 952 projecting light toward and through the dynamic mask 954 (e.g. a digital micromirror device). The mask 954 reflects light to beam splitters 980 which direct portions of light toward microlens arrays 956.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A system for synthesizing microstructures comprising:
a light source;
a mask having or generating at least one mask feature and being positioned to convey light from the light source ;
a moving target substrate having precursor material carried thereon; and,
an array of optical elements formed on a surface of a cylinder and positioned such that each optical element corresponds to a mask feature projected from the light source via the mask onto the moving target substrate to form microstructures in the precursor material.

2. The system as set forth in claim 1 wherein the array of optical elements is a microlens array.

3. The system as set forth in claim 1 wherein the array of optical elements is a mirror array.

4. The system as set forth in claim 1 wherein the light source is an ultraviolet light source.

5. The system as set forth in claim 1 wherein the mask comprises at least one of a static mask or a digital micromirror device.

6. The system as set forth in claim 1 further comprising air gaps or sheaths positioned to prevent binding between the precursor material and the moving substrate or the array.

7. The system as set forth in claim 1 wherein the light source and mask are positioned on an interior of the cylinder.

8. The system as set forth in claim 1 wherein the light source and mask are positioned on an exterior of the cylinder.

9. The system as set forth in claim 1 wherein the cylinder is formed of glass material.

10. A system for synthesizing microstructures comprising:
a light source;
a mask having or generating at least one mask feature and being positioned to convey light from the light source;
an array of optical elements positioned such that each optical element corresponds to a mask feature projected from the light source via the mask; and,
a cylinder having a surface with wells formed therein to align with the optical elements, the surface configured to carry precursor material in which microstructures are formed based on light projected from the light source onto the precursor material.

11. The system as set forth in claim 10 further comprising a source for the precursor, the source being configured to coat the cylinder with the precursor material.

12. The system as set forth in claim 10 further comprising a target to which formed particles are transferred from the cylinder.

13. The system as set forth in claim 10 wherein the array of optical elements is on the surface of the cylinder.

14. The system as set forth in claim 10 wherein the array of optical elements is positioned on the exterior of the cylinder.

15. The system as set forth in claim 10 wherein the light source and mask are positioned on an interior of the cylinder.

16. The system as set forth in claim 10 wherein the light source and mask are positioned on an exterior of the cylinder.

17. The system as set forth in claim 10 wherein the cylinder is formed of a glass material.

18. The system as set forth in claim 10 wherein the light source is an ultraviolet light source.

19. The system as set forth in claim 10 wherein the mask comprises at least one of a static mask or a digital micromirror device.

20. The system as set forth in claim 10 further comprising air gaps or sheaths positioned to prevent binding between the precursor material and the moving substrate or the array.

21. The system as set forth in claim 10 wherein the array of optical elements is a microlens array.

22. The system as set forth in claim 10 wherein the array of optical elements is a mirror array.

23. A system for synthesizing microstructures comprising:
   a light source;
   a mask having or generating at least one mask feature and being positioned to convey light from the light source;
   a moving target substrate having precursor material carried thereon;
   an array of optical elements positioned such that each optical element corresponds to a mask feature projected from the light source via the mask onto the moving target substrate to form microstructures in the precursor material; and
   air gaps or sheaths positioned to prevent binding between the precursor material and the moving substrate or the array.

24. The system as set forth in claim 23 wherein the array of optical elements is a microlens array.

25. The system as set forth in claim 23 wherein the array of optical elements is a mirror array.

26. The system as set forth in claim 23 wherein the light source is an ultraviolet light source.

27. The system as set forth in claim 23 wherein the mask comprises at least one of a static mask or a digital micromirror device.

28. A system for synthesizing microstructures comprising:
   a light source;
   a dynamic mask comprising at least one digital micromirror device and having or generating at least one mask feature and being positioned to convey light from the light source;
   a moving target substrate having precursor material carried thereon;
   an array of optical elements positioned such that each optical element corresponds to a mask feature projected from the light source via the dynamic mask onto the moving target substrate to form microstructures in the precursor material; and
   air gaps or sheaths positioned to prevent binding between the precursor material and the moving substrate or the array.

29. The system as set forth in claim 28 wherein the array of optical elements is a microlens array.

30. The system as set forth in claim 28 wherein the array of optical elements is a mirror array.

31. The system as set forth in claim 28 wherein the light source is an ultraviolet light source.

* * * * *